United States Patent [19]

Espaignol

[11] 4,283,734
[45] Aug. 11, 1981

[54] PROCESS FOR THE MANUFACTURE OF MILLIMETER WAVE SOURCES OF THE MODULE TYPE

[75] Inventor: Jacques Espaignol, Paris, France
[73] Assignee: Thomson-CSF, Paris, France
[21] Appl. No.: 20,737
[22] Filed: Mar. 15, 1979
[30] Foreign Application Priority Data
Mar. 17, 1978 [FR] France ................. 78 07800
[51] Int. Cl.³ .......................................... H01L 23/02
[52] U.S. Cl. ........................................ 357/81; 29/580; 29/583; 357/56
[58] Field of Search ............... 29/580, 583, 589; 357/56, 81

[56] References Cited
U.S. PATENT DOCUMENTS

| | | | |
|---|---|---|---|
| 3,689,993 | 9/1972 | Tolar | 29/580 |
| 3,820,236 | 6/1974 | Haitz | 29/580 |
| 4,035,830 | 7/1977 | Kim | 357/81 |

Primary Examiner—W. C. Tupman
Attorney, Agent, or Firm—Oblon, Fisher, Spivak, McClelland & Maier

[57] ABSTRACT

A batch production process for millimeter wave sources of a module type. This module type consists of a basic metallic support, bearing a diode under the form of a semiconductor chip soldered on a projection of the support, the diode being surrounded by a dielectric substance forming a medium extending up to half a wavelength on the same support, with a metallization covering the surrounding medium and connected with the top of the chip by a metallic block. In a first embodiment, the batch process is limited to the central part of the module i.e. the semiconductor chip, the block and only a part of the dielectric medium, as well as a part of the metallic support. In a second embodiment of the process, the collective production of the entire module is achieved.

8 Claims, 18 Drawing Figures

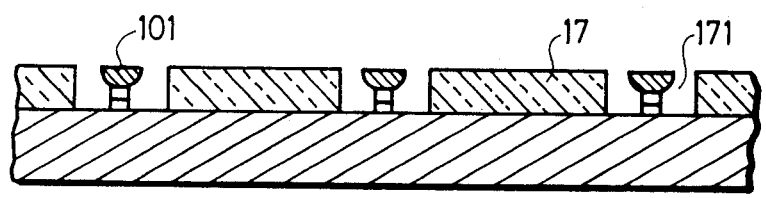
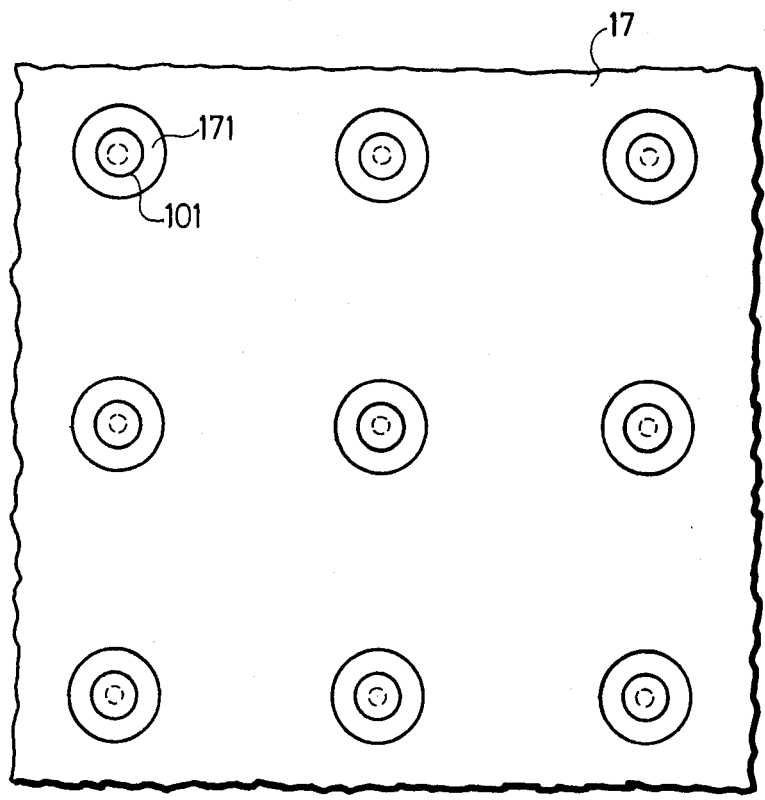

PROCESS FOR THE MANUFACTURE OF MILLIMETER WAVE SOURCES OF THE MODULE TYPE

The invention relates to a process for the manufacture of millimeter waves sources of the "module" type, that is to say comprising a semiconductor diode capable of oscillating at very high frequency, embedded in a dielectric medium of pre-determined dimensions, the diode being in contact with a heat and electricity conducting support.

The invention is changing over from manufacture using unitary technology to manufacture using collective technology.

In addition, the invention enables the possible applications of this type of sources to be improved:

(a) by varying the respective dimensions of the diode and of the dielectric medium surrounding it to a greater extent than in the case of known designs;

(b) by protecting the active part of the diode from any untimely grinding when manufacturing the module.

According to the invention there is provided a process for the manufacture of sources of millimeter waves, comprising at least the following stages:

A. Production of a semiconductor plate comprising a substrate and active layers constituting with the substrate a semiconductive structure;

B. Addition of a support with low thermal resistance constituted by a first metal, resistant to certain chemical agents, on the side of the active layers of the plate;

C. Grinding the substrate, followed by depositing a thin layer of the first metal and a thick layer of a second metal that can be selectively attacked by a chemical agent in the presence of the first metal;

D. Formation by photolithography of a large number of studs of the first metal penetrating the second metal up to the first layer of the first metal;

E. Selectively attacking the second metal, baring the studs, followed by etching the thin layer in the portions not protected by the studs;

F. Selectively attacking the semiconductor material, allowing a block of this material to remain underneath each stud, with the volume of a stud substantially exceeding the volume of the block;

G. Finishing of the sources, comprising the cutting out of individual elements.

In a first embodiment of the invention, an additional stage, between stages F and G, consists in depositing a layer of polymerisable resin having, after polymerisation, a predetermined dielectric coefficient; stage G then comprises the following sub-stages:

cutting out the individual sources comprising an individual support element, a diode and a contact stud;

positioning the individual source on a support with low thermal resistance;

positioning an impedance adapter of a dielectric material with a dielectric coefficient close to that of the resin deposited during the additional stage;

metallizing the upper portion of the adapter in a disc shaped zone.

In a second embodiment of the invention, the studs are collectively produced, in stage D, in such a way that the distance between studs is about the half-length of the wave emitted by the source in the dielectric medium.

Stage G is then broken down into graduated sub-stages as follows:

manufacture of a dielectric plate pierced by cylindrical bores whose diameter and arrangement are such that the plate can be placed on the support common to all of the sources by housing each source in the centre of one of the bores in the dielectric plate;

filling in the interstices between diodes and dielectric with the resin with a predetermined dielectric coefficient;

metallization analogous to that in the previous stage G, but effected collectively;

cutting out the support along the lines of a grid pattern passing between the diodes;

The invention will be more readily understood and other features will become apparent from the description that follows and from the accompanying drawings, wherein:

FIGS. 1 to 14 represent stages in the first embodiment of the invention;

FIGS. 15 to 18 represent certain typical stages in the second embodiment of the invention.

Figure 1:
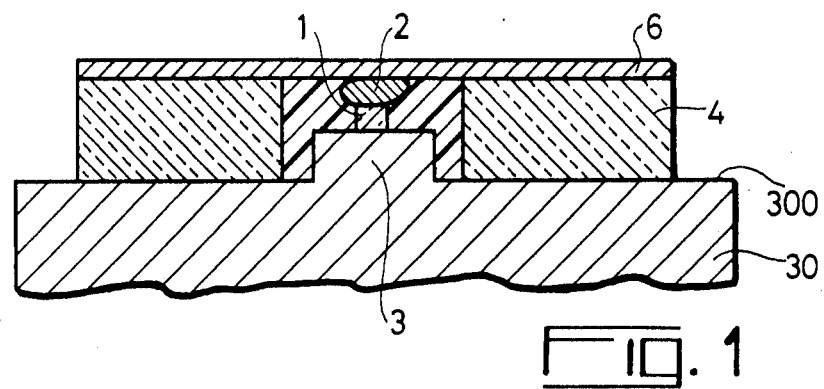
FIG. 1 illustrates a known system.

FIG. 1 represents a millimeter wave source of the module type. It comprises a semiconductor diode 1 whose dimensions are small (less than 100 microns) that is capable of oscillating, generating millimeter electromagnetic waves. This diode is mounted at the top of a central projection 3 from a platform 300 constituting the upper portion of a gold-plated copper support 30.

Diode 1 is topped by a gold block or stud 2 which is larger than the diode itself. The top of the block is flattened. Projection 3 is surrounded by a ring 4 of glass of the "quartz" (fused silica) type with a square or rectangular cross-section resting on the platform 300. The interval remaining between the central portion of the source and the glass ring is filled with a resin whose dielectric coefficient is close to that of the glass constituting the ring and capable, moreover, of withstanding high temperatures in the order of 300° to 500° C.; it is, for example, polyimide resin. A circular metallized area 6 covers the upper portion, in particular the stud 2. This metallized area constitutes the polarizing electrode of the source, with support 30 constituting earth.

In such a source, the frequency of oscillation depends on the dimensions (diameter and height) of the glass ring and the diameter of the circular metallized area. It can be seen that the source can be pre-tuned by selecting not only the diameter but also the height, while retaining the same support 30 and the same diode 1, on condition that the thickness of stud 2 is varied.

The following is a description of the stages of the process according to the invention taking as an example the manufacture of modules according to the first embodiment of the invention: in this case, the plate is cut into unitary diodes before fitting the impedance adapter of each diode, i.e. a glass ring in the case of the module shown in FIG. 1.

Figure 2:
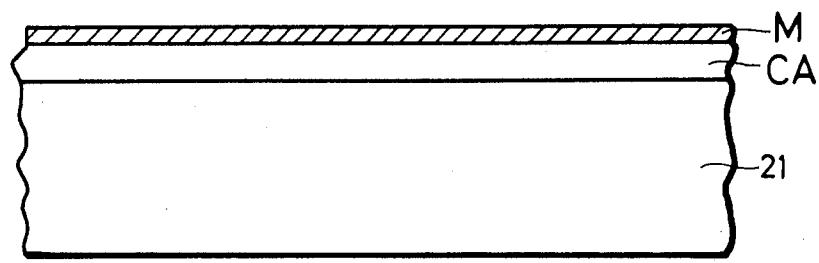

FIG. 2 is a partial cross-sectional view of the result obtained during stage A (production of a semiconductor plate) using a substrate 21, which is, for example, a disc of gallium arsenide or N+ doped monocrystalline silicon. Two active layers doped, for example, as follows have been epitaxially formed on the disc 21:

N and N+ layers in the case of a Gunn diode;

N and P+ layers in the case of an avalanche diode.

In order to simplify the drawings, the active layers have not been represented in detail; the detail can, moreover, be more complex; the group of active layers is designated by the reference CA in FIG. 2 and the subsequent Figures.

Finally, a metallized zone M, which can be constituted by layers of different metals, the last layer, however, being gold in the present example, as been deposited on the active layers.

Figure 3:
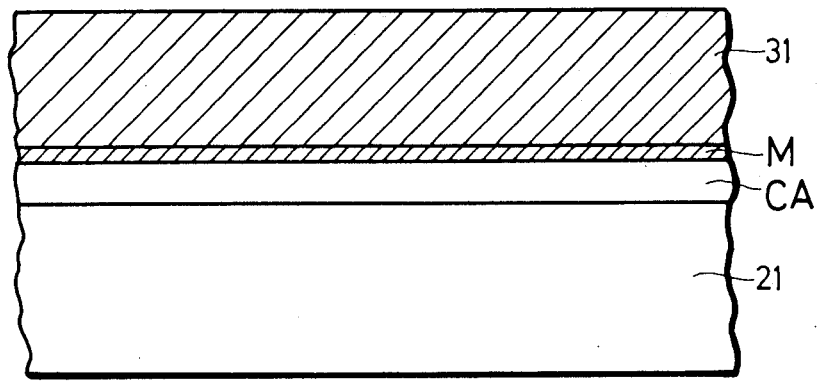

FIG. 3 represents the plate 21, treated in stage (A), at the end of stage (B), after the addition of a support with a low thermal resistance, in the present example a thick layer 31 (about one hundred microns) electrolytically deposited on the gold plating of layer M.

Figure 4:
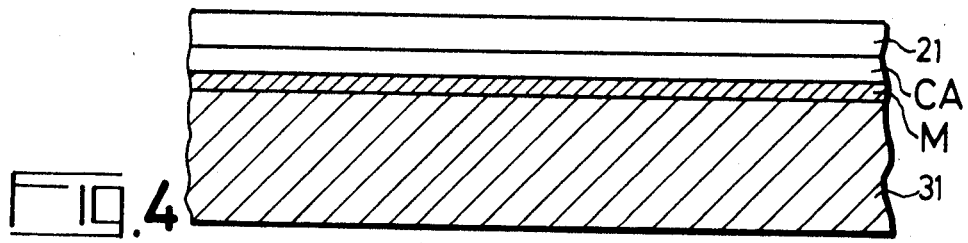
Figure 5:
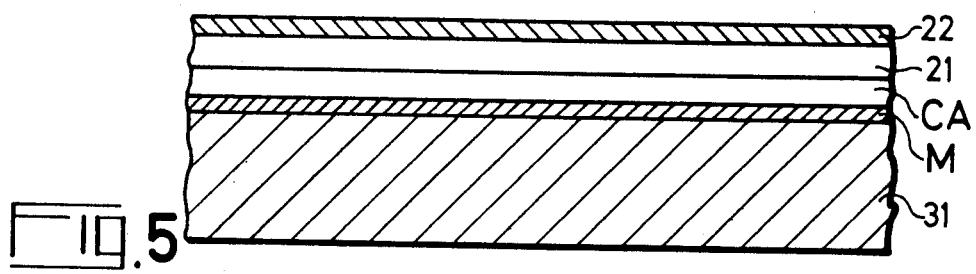
Figure 6:
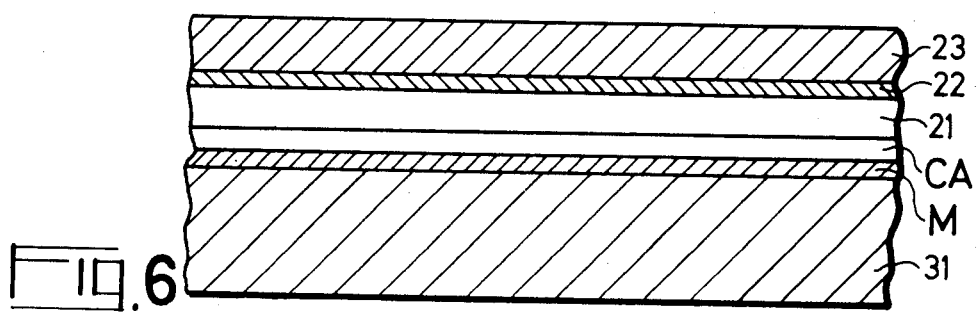
Figure 7:
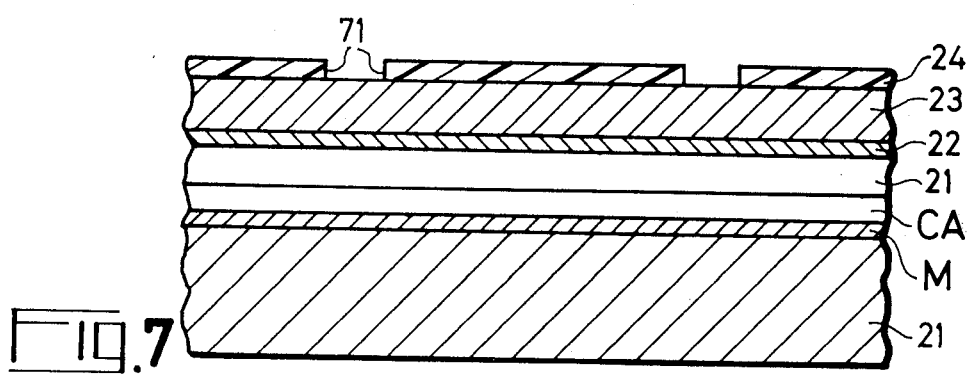
Figure 8:
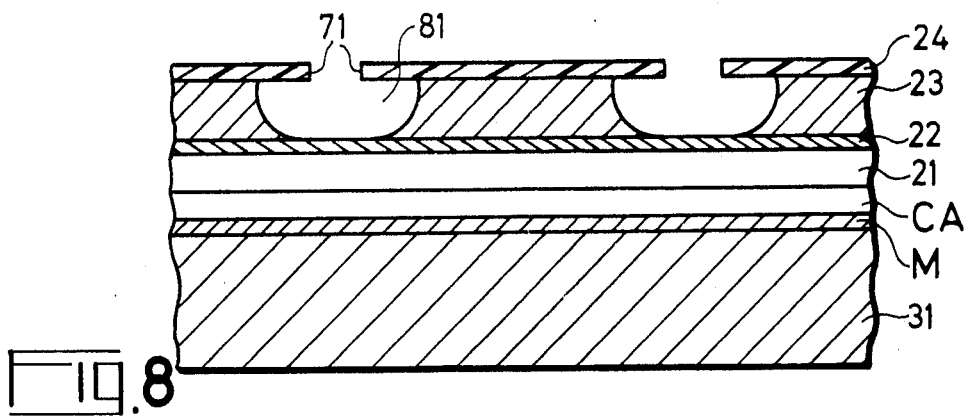
Figure 9:
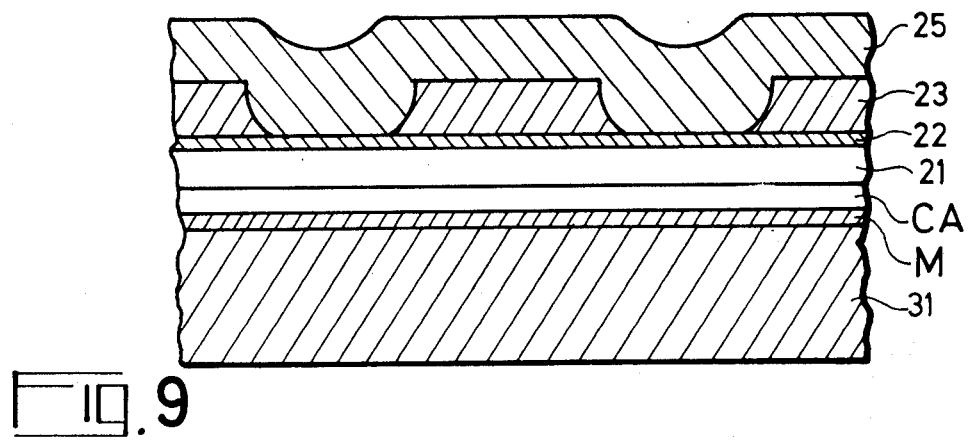
Figure 10:
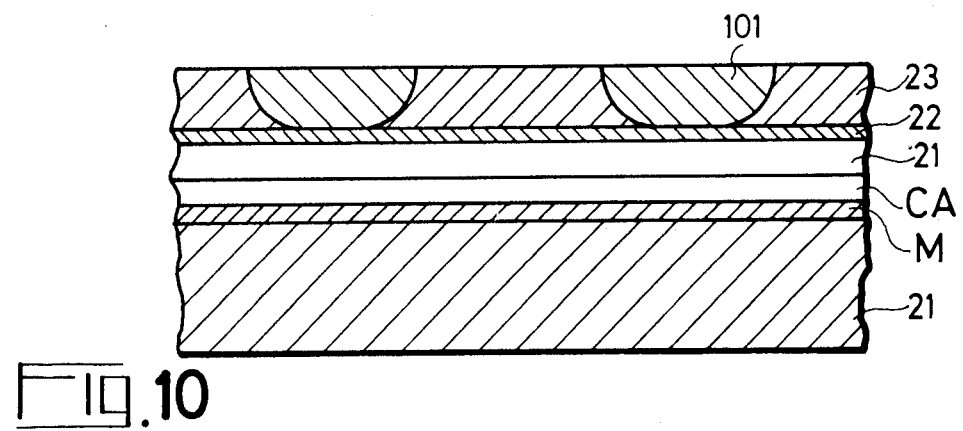

FIGS. 4, 5 and 6 represent three steps of stage C:

($c_1$) wherein the substrate 21 (FIG. 4) is ground down to reduce its thickness to approximately twenty microns;

($c_2$) wherein the ground face of substrate 21 is metallized, giving a layer 22 analogous to the metallized zone M and represented in FIG. 5;

($c_3$) wherein a copper layer 23 is deposited, the thickness of said layer being determined as a function of the studs to be obtained above the final diode, i.e. from 10 to 100 microns depending on the case;

FIGS. 7, 8, 9 and 10 represent four steps of stage D, namely:

($d_1$) wherein circular zones of chemical attack of layer 23 are delimited; FIG. 7 shows, after photographic development, a layer, 24, of photosensitive resin previously treated by insolation through a suitable mask (not illustrated); these zones take the material form of openings, 71, in layer 24, the diameter of said zones being considerably less than that of the studs to be produced;

($d_2$) wherein layer 23 is etched, using iron perchloride for example, through the openings 71, which results in bowl cavities 81 (FIG. 8); chemical attack is arrested when the bowl reaches a predetermined size;

($d_3$) wherein the resin 24 is dissolved and a gold layer, 25, is electrolytically deposited, (FIG. 9), the thickness of said layer being greater than the depth of the bowls 81;

($d_4$) wherein the layer 25 is ground down until all that remains is the upper face of the studs 101 embedded in the remainder of layer 23 (FIG. 10).

Figure 11:
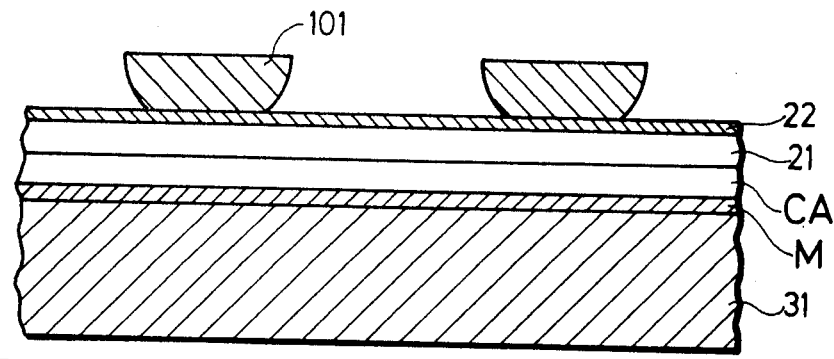
Figure 12:
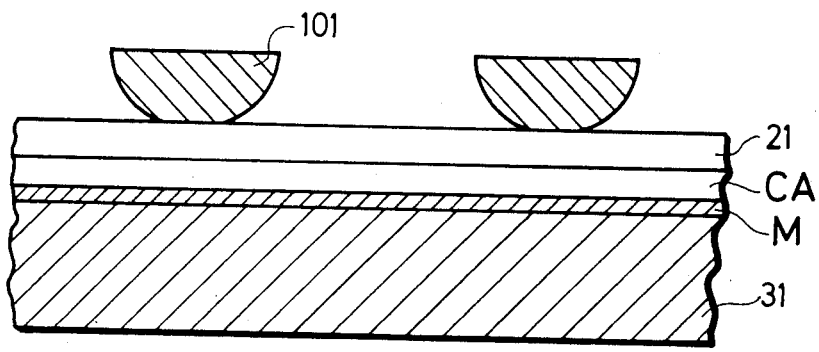

FIGS. 11 and 12 represent two steps of stage E: in the first of said steps, chemical attack is effected with the same agent as in step $d_2$ until the copper of layer 23 disappears completely; in the second of these steps, chemical attack is effected using a chemical agent that is capable of acting upon the metallized zone 22, for example aqua regia in the case of gold. This attack is arrested immediately the metallized zone 22, approximately half a micron at most, has been eliminated, which enables the greater part of studs 101 to be spared.

Figure 13:
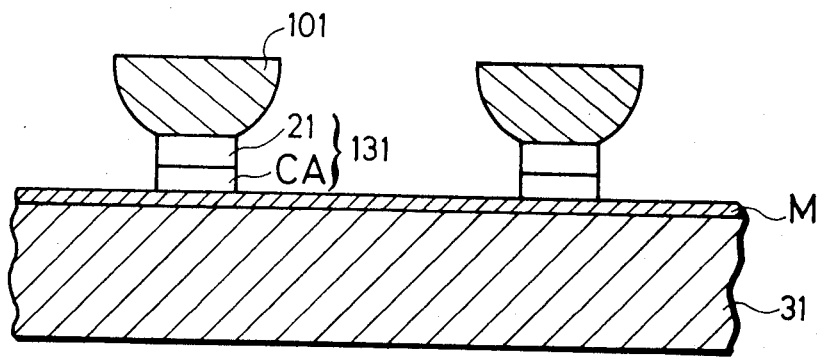

FIG. 13 represents the result obtained in stage F after selective attack on the semiconductor material, using, for example, a mixture of sulphuric acid and hydrogen peroxide in the case of gallium arsenide. Chemical attack is halted when the semiconductor material is reduced to a block, 131, that is far smaller than stud 101.

Figure 14:
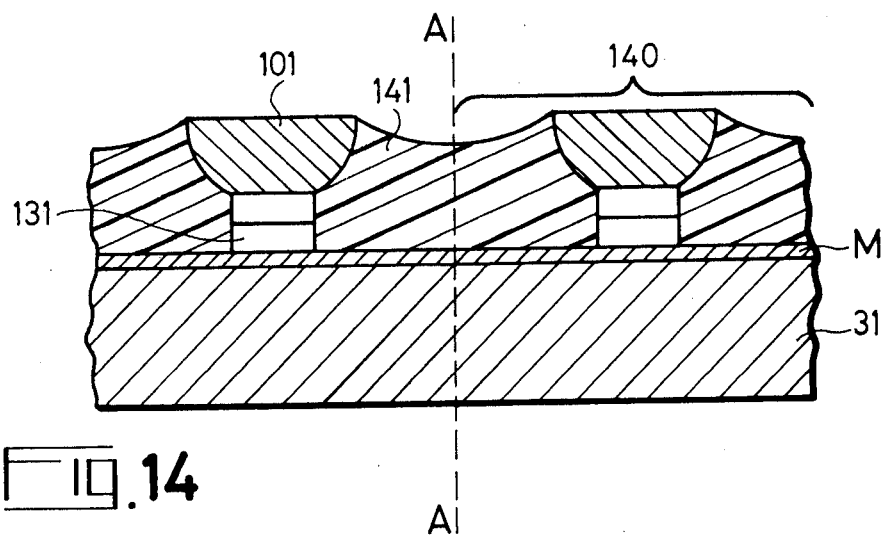

FIG. 14 represents the result obtained during an additional stage, inserted between stages F and G, in the case of the first embodiment. During this stage, the interstices between the studs 101 and associated diodes have been filled in using a polymerisable resin resulting, after polymerisation, in a material having a predetermined dielectric coefficient. For example, in the case of polyimide resin, this enables a module to be obtained, said module comprising a glass ring of the "quartz" type.

In the first embodiment, the plate is cut out along trace planes AA (FIG. 14) located at equal distances from two studs 101.

In this way, we obtain blocks, 140, which replace, in the module represented in FIG. 1, the assembly of diode 1, its stud 2 and the central projection 3 of the support 30, said projection being considered independently of said support. The technology for the production of the module in this case is then analogous in its latter stages to that resulting in the module shown in FIG. 1, but differing in that the support 30 is smooth, that is to say does not have a central projection.

Figure 15:
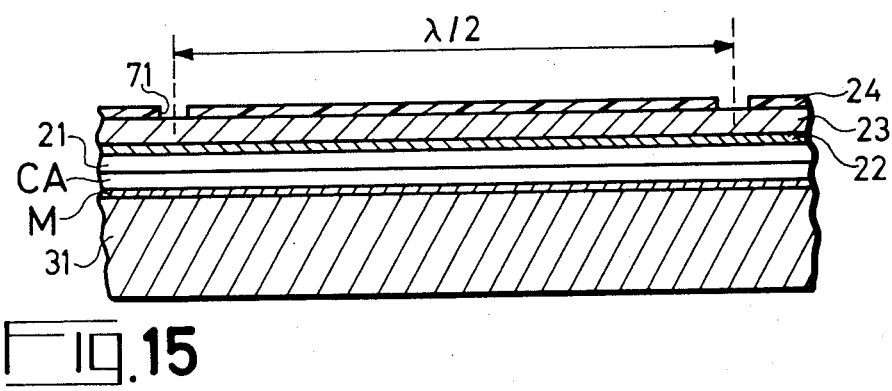

The second embodiment of the invention can be effected from the semiconductor plate illustrated in FIG. 2, using a technology identical with that of the first stages A, B and C described above. FIG. 15 (analogous to FIG. 7) represents the result of treatment in step $d_1$ of stage D. It can be seen that the openings 71 photoetched in layer 24 are far further from one another than in the preceding case. The centre to centre distance is at least equal to the half wavelength of an electromagnetic wave at the emission frequency of the source in a given dielectric medium, in practice, that of the characteristic dielectric of the module.

Figure 16:
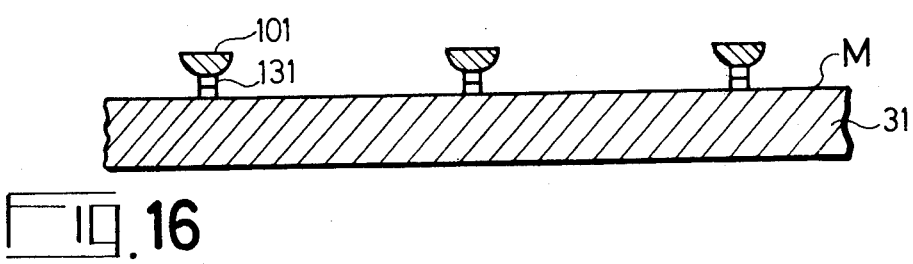

FIG. 16 shows the result obtained using a technology identical with that of steps $d_2$ to $d_4$ of stage D, and of stages E and F. This result is analogous to that represented in FIG. 13. For simplicity, however, metallized zone M has been represented as a simple line.

Figure 18B:
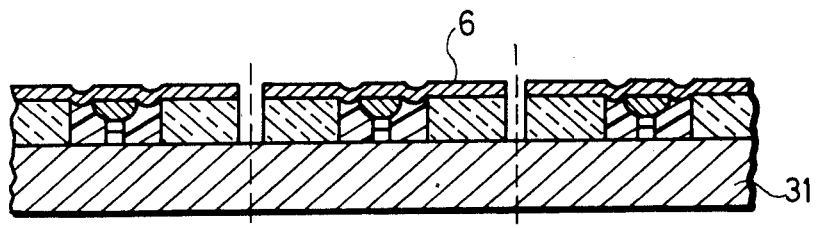
Figure 18A:
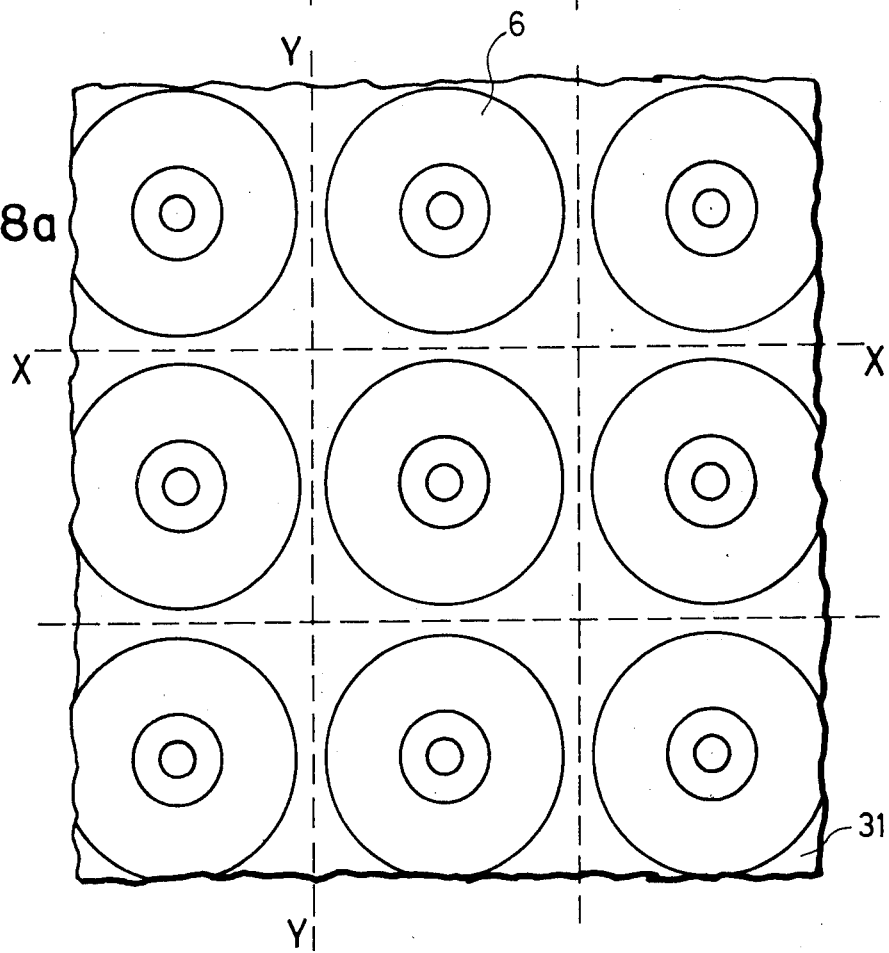

FIGS. 17 and 18 represent two of the five steps in stage G in the second embodiment. Said steps are as follows:

($g_1$) wherein a glass plate, 17, of the "quartz" type, pierced by holes 171 (obtained, for example, by sand blasting) is placed as shown in FIG. 17, in a plane (a), and as cross-sectionally represented by (b), in such a way as to take up the vacant space between diodes, while leaving the remaining space, 171, to be filled with resin constituting a dielectric medium as close as possible to that of the glass;

($g_2$) wherein spaces 171 are filled with polymerisable resin, for example of the polyimide type;

($g_3$) wherein the upper face of the plate is metallized (in circular deposits 6);

($g_4$) wherein the support 31 is cut out along trace planes XX and YY defining a rectangular grid surrounding the deposits 6.

In an alternative form of embodiment of stage G, the glass plate 17 is replaced by a deposit of epoxy type resin, which is polymerisable and previously filled with silicon dioxide or boron nitride; such resins, in particular that bearing the trade-mark EPOTEK, reference H 70 S, filled with silicon dioxide, are commercially available. In this form of embodiment, there is no more interstices such as the spaces 171; one operation, that of step $g_2$, is thus obviated.

In another form of embodiment of the invention, the studs 101 are obtained by ionic treatment by replacing the copper of layer 23 with gold that is directly obtained in place of the copper by electrolytic growth. Such treatment is possible if the studs to be produced are protected by a series of titanium or chromium discs whose rate of erosion is far less rapid than that of gold: a titanium or mask with a thickness of 7 microns enables a gold layer of 50 microns to be removed.

Among the advantages of the invention not yet indicated, mention can be made of the following:

the fact that the diode is protected from any undesirable mechanical grinding, which prevents damage to the crystal lattice and increases the likelihood of correct functioning after manufacture;

the fact that the thermal resistance is very low both on the side of the semiconductor substrate and on that of the active layers;

the fact that the technology used is relatively simple and inexpensive.

What we claim is:

1. A process for the manufacture of sources of millimeter waves, comprising at least the following stages:
   A. production of a semiconductor plate comprising a substrate and active layers constituting with the substrate a semiconductive structure;
   B. addition of a support with low thermal resistance constituted by a first metal, resistant to certain chemical agents, on the side of the active layers of the plate;
   C. grinding the substrate, followed by depositing a thin layer of the first metal and a thick layer of a second metal that can be selectively attacked by a chemical agent in the presence of the first metal;
   D. formation by photolithography of a large number of studs of the first metal penetrating the second metal up to the first layer of the first metal;
   E. selectively attacking the second metal, baring the studs, followed by etching the thin layer in the portions not protected by the studs;
   F. selectively attacking the semiconductor material, allowing a block of this material to remain underneath each stud, with the volume of a stud substantially exceeding the volume of the block;
   G. finishing of the sources, comprising the cutting out of individual elements.

2. A process according to claim 1, comprising an additional stage, located between stages F and G, consisting in depositing about the diode and the stud a layer of polymerisable resin having, after polymerisation, a pre-determined dielectric coefficient, and in that stage G comprises the following steps:

cutting out individual sources comprising a support element, diode and a stud;

positioning the individual source on a support with low thermal resistance;

positioning an impedance adaptor of dielectric material with a dielectric coefficient close to that of the resin deposited during the additional stage;

metallization of the upper portion of the adaptor in a disc-shaped area.

3. A process according to claim 2, wherein the resin deposited around the diode and the stud is, after polymerisation, of the polyimide resin type, and in that the impedance adaptor is a glass ring.

4. A process according to claim 1, comprising during stage D, production of studs that are distant by at least a half wavelength of a wave emitted by the source in a pre-determined dielectric medium, and in that stage G comprises the following steps:

manufacture of a dielectric plate pierced with cylindrical bores whose diameter and arrangement are such that it is possible to place the plate on the support common to the group of sources by housing each source in the centre of a hole in the dielectric plate;

filling in the interstices between diode and dielectric by resin with a given dielectric coefficient;

metallizing the upper face of the assembly in circular deposits;

cutting out the support along the lines of a grid passing between the circular deposits;

5. A process according to claim 1, wherein stage C comprises the following steps:
   ($c_1$), wherein the substrate is ground down until its thickness is reduced to the same order of magnitude as that of the active layers;
   ($c_2$), wherein the ground face of the substrate is metallized;
   ($c_3$), wherein a layer of copper whose thickness is determined as a function of the studs to be obtained in stage D is deposited.

6. A process according to claim 1, wherein stage D comprises the following steps:
   ($d_1$), wherein circular zones of chemical attack on the copper are delimited by depositing light-sensitive resin, masking, insolation and photographic development;
   ($d_2$), wherein the non-protected copper is etched by chemical attack in order to obtain bowl-shaped cavities;
   ($d_3$), wherein the resin is dissolved and the bowls are filled by depositing a sufficient layer of gold on the plate;
   ($d_4$), wherein the gold layer deposited in the preceding stage is ground.

7. A process according to claim 1, wherein stage E comprises the following steps:

complete elimination of the copper by a first chemical attack;

elimination, by means of a second chemical attack, of the metallized zone about the studs.

8. A millimeter wave source, manufactured by a process according to claim 1, the metallized area deposited on the studs constituting a polarising electrode and the support with low thermal resistance constituting the earth.

* * * * *